United States Patent
Kumar (10) Patent No.: US 9,735,782 B1
(45) Date of Patent: Aug. 15, 2017

(54) SYSTEMS AND METHODS FOR CONFIGURING A FIELD PROGRAMMABLE DEVICE

(71) Applicant: Wipro Limited, Bangalore (IN)

(72) Inventor: Kodavalla Vijay Kumar, Bangalore (IN)

(73) Assignee: Wipro Limited, Bangalore (IN)

(*) Notice: Subject to any disclaimer, the term of this patent is extended or adjusted under 35 U.S.C. 154(b) by 0 days.

(21) Appl. No.: 15/085,634

(22) Filed: Mar. 30, 2016

(30) Foreign Application Priority Data

Mar. 29, 2016 (IN) .............................. 201641010887

(51) Int. Cl.
  *H03K 19/177* (2006.01)
  *G06F 17/50* (2006.01)
  *G06F 15/78* (2006.01)

(52) U.S. Cl.
  CPC . *H03K 19/17748* (2013.01); *H03K 19/17728* (2013.01); *H03K 19/17736* (2013.01)

(58) Field of Classification Search
  CPC ....... H03K 19/17748; H03K 19/17728; H03K 19/17736; H03K 19/177; G06F 17/5054; G06F 17/5045; G06F 17/5072; G06F 15/7867; G06F 17/5068
  USPC ......................... 326/37–41, 47; 716/116, 117
  See application file for complete search history.

(56) References Cited

U.S. PATENT DOCUMENTS

| | | | | |
|---|---|---|---|---|
| 7,902,863 | B1* | 3/2011 | Tetzlaff ............... | G06F 17/5054 326/38 |
| 2002/0100029 | A1* | 7/2002 | Bowen ..................... | G06F 8/41 717/140 |
| 2003/0080776 | A1* | 5/2003 | Kohno ................ | G06F 17/5054 326/39 |
| 2015/0347642 | A1* | 12/2015 | Chatterjee ........... | G06F 17/5054 716/102 |

* cited by examiner

Primary Examiner — Dylan White
(74) *Attorney, Agent, or Firm* — LeClairRyan, a Professional Corporation (57) ABSTRACT

This technology relates generally to integrated circuit technologies, and more particularly, to methods and systems for configuring a field programmable device. In one embodiment, a method for configuring a field programmable device is provided. The method comprises: identifying information associated with a plurality of logic functions associated with a plurality of subsystems to be implemented on a field programmable device; determining, based on the information, a set of attributes associated with each of the plurality of subsystems; determining, based on the set of attributes, a first value indicative of an estimation of a total number of the sequential logic blocks, and a second value indicative of an estimation of a total number of the combinational logic blocks, for implementing the plurality of logic functions; determining, based on the first and second values, to configure a first field programmable device for implementing the plurality of logic functions.

18 Claims, 3 Drawing Sheets

FIG. 3: Example Computer System

SYSTEMS AND METHODS FOR CONFIGURING A FIELD PROGRAMMABLE DEVICE

This application claims the benefit of Indian Patent Application Serial No. 201641010887, filed Mar. 29, 2016, which is hereby incorporated by reference in its entirety.

FIELD

This disclosure relates generally to integrated circuit technologies, and more particularly, to methods and systems for configuring a field programmable device.

BACKGROUND

Field programmable device, such as a field programmable gate array (FPGA) and a complex programmable logic device (CPLD), can be configured to implement various logical functions. The logical functions can include, for example, an arithmetic operation (e.g., addition, subtraction, multiplication and division of input data), a control processing (e.g., generating a sequence of states and outputs at pre-determined times based on input data), etc. Logic functions for arithmetic operations and control processing can be implemented using a combination of combinational logic blocks and sequential logic blocks. However, logic blocks for arithmetic operations are typically dominated by combinational logic blocks, while logic blocks for control processing are typically dominated by sequential logic blocks.

A field programmable device includes an array of programmable logic blocks, which may include a set of look-up tables, combinational logic gates, flip flops, and routing matrices, as well as components including embedded memories, input/output buffers, phased locked loops (PLL), delay locked loops (DLL), clock buffers, etc. These logic blocks and components can be configured, using a hardware description language (HDL) such as VHDL, Verilog, etc., to implement the aforementioned logic functions. The HDL can be configured to describe the behaviors of certain logic blocks (e.g., an arithmetic logic unit for arithmetic operation, a finite state machine to generate a sequence of states and outputs, etc.). A software compiler can compile a program file that includes HDL associated with the logic blocks, and generate a set of low level programming instructions. The low level programming instructions can then configure the logic blocks and components (e.g., look-up tables, flip flops, and routing matrices, etc.) of the field programmable device to implement the logic functions.

Different field programmable devices may have different technical specifications, such as a number of components (e.g., look-up tables that implement the combinational logic gates, flip flops, routing matrices, etc.) available for configuration. The number of components can be expressed in terms of an aggregate gate count that represents a total number of equivalent NAND2 logic gates for all the available logic blocks (including combinational and sequential logic blocks). Under conventional technologies, a field programmable device is selected to implement a logic function, if an aggregate gate count associated with the logic function (e.g., an aggregate gate count associated with the combinational and sequential logic blocks for implementing the logic function) is below the available aggregate gate count of the field programmable device. The field programmable device is then configured using the HDL to implement the logic function.

The inventors here have recognized several technical problems with the conventional method of selecting and configuring the field programmable device. First, without distinguishing the gate counts for sequential logics and combinational logics for a logic function, the selected field programmable device may be ill-suited to implement that logic function. As discussed above, logic blocks for arithmetic operations are typically dominated by combinational logic blocks, while logic blocks for control processing are typically dominated by sequential logic blocks. A field programmable device with lots of combinational logic gates but relatively few flip flops available for configuration may not be suitable to implement a logic function for control processing, even if the aggregate gate count for that field programmable device exceeds the aggregate count associated with the logic function for control processing. Second, by selecting a field programmable device to implement a logic function based only on whether the aggregate gate count associated with the logic function is less than the available aggregate gate count of the field programmable device, the selected field programmable device can also become underutilized, if a majority of its devices (e.g., combinational logic gates, sequential logic blocks, etc.) are not needed to implement that logic function, which can lead to inefficient usage of field programmable device resources.

SUMMARY

Embodiments of the present disclosure present technological improvements as solutions to the above-mentioned technical problems, among others.

For example, in one embodiment, a method for configuring a field programmable device is provided. The method may be performed by a hardware processor and comprises: identifying information associated with a plurality of logic functions associated with a plurality of subsystems to be implemented on a field programmable device; determining, based on the information, a set of attributes associated with each of the plurality of subsystems, the set of attributes including an expected gate count, one or more clock frequencies, process node information, and one or more of the plurality of logic functions; determining, based on the set of attributes, a first value indicative of an estimation of a total number of sequential logic blocks, and a second value indicative of an estimation of a total number of combinational logic blocks, for implementing the plurality of logic functions; determining, based on the first and second values, whether to configure a first field programmable device for implementing the plurality of logic functions; and after determining to configure the first field programmable device, configuring the first field programmable device to implement the plurality of logic functions.

In another embodiment, a system for configuring a field programmable device is provided. The system comprises one or more hardware processors, and a memory storing instructions executable by the one or more hardware processors for: identifying information associated with a plurality of logic functions associated with a plurality of subsystems to be implemented on a field programmable device; determining, based on the information, a set of attributes associated with each of the plurality of subsystems, the set of attributes including an expected gate count, one or more clock frequencies, process node information, and one or more of the plurality of logic functions; determining, based on the set of attributes, a first value indicative of an estimation of a total number of sequential logic blocks, and a second value indicative of an estimation of a total number of combinational logic blocks, for implementing the plurality of logic functions; determining, based on the first and second values, whether to configure a first field programmable device for implementing the plurality of logic functions; and after determining to configure the first field programmable device, configuring the first field programmable device to implement the plurality of logic functions.

In yet another embodiment, a non-transitory computer readable storage medium is provided. The non-transitory computer readable storage medium stores a program that, when executed by one or more hardware processors, causes the one or more hardware processors to perform a method for configuring a field programmable device. The method comprises: identifying information associated with a plurality of logic functions associated with a plurality of subsystems to be implemented on a field programmable device; determining, based on the information, a set of attributes associated with each of the plurality of subsystems, the set of attributes including an expected gate count, one or more clock frequencies, process node information, and one or more of the plurality of logic functions; determining, based on the set of attributes, a first value indicative of an estimation of a total number of sequential logic blocks, and a second value indicative of an estimation of a total number of combinational logic blocks, for implementing the plurality of logic functions; determining, based on the first and second values, whether to configure a first field programmable device for implementing the plurality of logic functions; and after determining to configure the first field programmable device, configuring the first field programmable device to implement the plurality of logic functions.

It is to be understood that both the foregoing general description and the following detailed description are exemplary and explanatory only and are not restrictive of the invention, as claimed.

BRIEF DESCRIPTION OF THE DRAWINGS

The accompanying drawings, which are incorporated in and constitute a part of this disclosure, illustrate exemplary embodiments and, together with the description, serve to explain the disclosed principles.

DETAILED DESCRIPTION

Exemplary embodiments are described with reference to the accompanying drawings. In the figures, the left-most digit(s) of a reference number identifies the figure in which the reference number first appears. Wherever convenient, the same reference numbers are used throughout the drawings to refer to the same or like parts. While examples and features of disclosed principles are described herein, modifications, adaptations, and other implementations are possible without departing from the spirit and scope of the disclosed embodiments. It is intended that the following detailed description be considered as exemplary only, with the true scope and spirit being indicated by the following claims.

Illustrative embodiments of the present disclosure are listed below. In one embodiment, a method for configuring a field programmable device is provided. The method may be performed by a hardware processor and comprises: identifying information associated with a plurality of logic functions associated with a plurality of subsystems to be implemented on a field programmable device; determining, based on the information, a set of attributes associated with each of the plurality of subsystems, the set of attributes including an expected gate count, one or more clock frequencies, process node information, and one or more of the plurality of logic functions; determining, based on the set of attributes, a first value indicative of an estimation of a total number of sequential logic blocks, and a second value indicative of an estimation of a total number of combinational logic blocks, for implementing the plurality of logic functions; determining, based on the first and second values, whether to configure a first field programmable device for implementing the plurality of logic functions; and after determining to configure the first field programmable device, configuring the first field programmable device to implement the plurality of logic functions.

With embodiments of the present disclosure, when selecting a field programmable device to implement one or more logic functions, one or more attributes of the logic function, including a target clock frequency, a target process node, a nature of the logic function, and a gate count associated with the logic function will be determined. A pipeline factor and a speed factor will be determined based on the attributes. Based on the attributes, as well as the pipeline and speed factors, a first cumulative value indicative of an estimation of a number of the sequential logic blocks to implement the logic functions (or subsystems associated with the logic functions), and a second cumulative value indicative of an estimation of a number of the combinational logic blocks to implement the logic functions (or subsystem associated the logic functions), can be determined. A field programmable device can be selected to implement the logic function, if a number of available sequential logic blocks (e.g., flip flops) and a number available combinational logic blocks (e.g., look up table) of the device exceed, respectively, the first and second cumulative values, and that the utilization rate of the device's sequential and combinational logic blocks, when programed to implement the logic function, exceeds a certain threshold. Using a more refined gate count requirement for selecting a field programmable device, a degree of fitness of the selected device for implementing a logic function, as well as the utilization of the selected device when implementing that logic function, can be improved.

Figure 1:
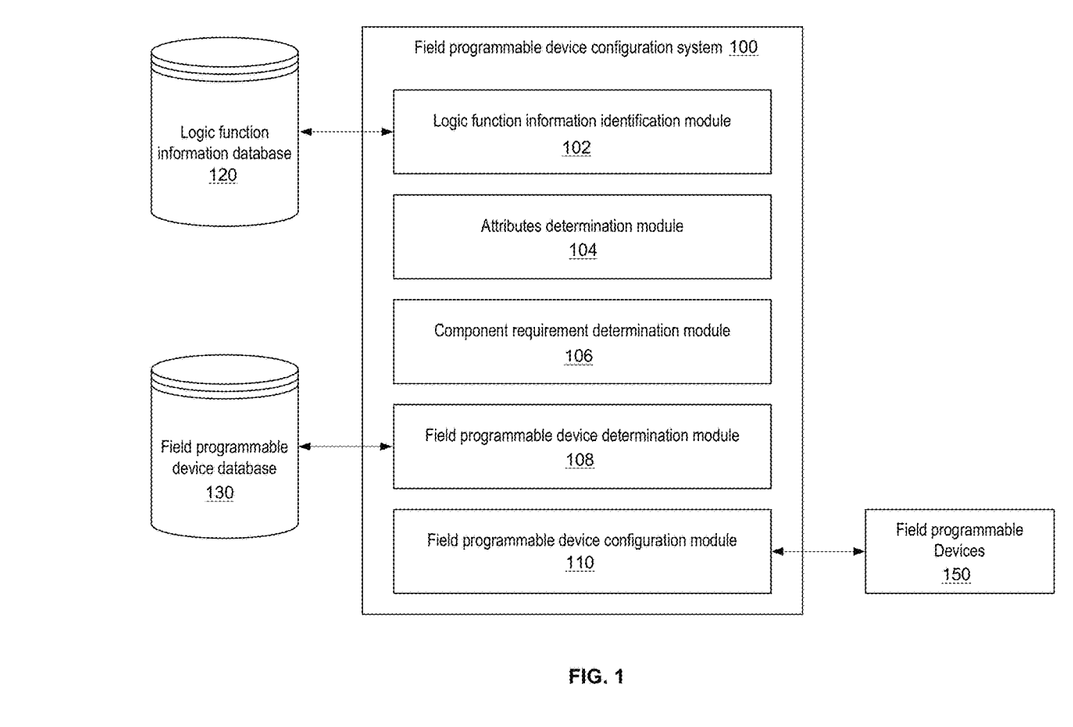
FIG. 1 illustrates an exemplary system for configuring a field programmable device, according to embodiments of the present disclosure.

FIG. 1 illustrates an exemplary field programmable device configuration system 100 for selecting and configuring a field programmable device to implement one or more logic functions, according to embodiments of the present disclosure. As shown in FIG. 1, field programmable device configuration system 100 may include a logic function information identification module 102, an attributes determination module 104, a component requirement determination module 106, a field programmable device determination module 108, and a field programmable device configuration module 110. Field programmable device configuration system 100 may also interfaces with a logic function information database 120, a field programmable device database 130, and one or more field programmable devices 150. In some embodiments, field programmable device configuration system 100 can be part of, or can operate in conjunction with, an electronic design automatic (EDA) tool.

For the purposes of this disclosure, "modules" may be implemented in software, hardware, firmware, a mix of any of those, or the like. For example, if the disclosed "modules" are implemented in software, they may be stored in a memory associated with field programmable device configuration system 100. Processors, I/O devices, and memory devices may be used to perform processes to implement and facilitate operations of the modules. Thus, the modules may include code instructions executable by one or more processors, alone or in various combinations with other modules disclosed in this or other embodiments. If the disclosed "modules" are implemented in hardware, they may comprise an embedded system or other dedicated hardware configured by machine code, assembly code, or the like to interact with other modules to perform functions consistent with disclosed embodiments.

In some embodiments, logic function information identification module 102 can identify information about one or more logic functions associated with a plurality of circuits to be implemented on a field programmable device (e.g., one of field programmable devices 150). The logic functions can include, for example, an arithmetic operation (e.g., addition, subtraction, multiplication and division of input data), and a control processing (e.g., generating a sequence of states and outputs at pre-determined times based on input data), etc. The information associated with the logic functions can include various parameters, for example, target clock frequencies, target process nodes, a nature of the logic functions (e.g., whether the logic functions are predominantly for arithmetic operation or for control processing), and an expected number of circuit components for implementing the logic functions, which can be represented in terms of a count of equivalent NAND2 gates. The gate count is typically in the units of kilo-gates or million-gates. The clock frequency is typically in the unit of mega-Hz (MHz) or giga-Hz (GHz).

In a case where the field programmable device is to emulate the behavior of an application specific integrated circuit (ASIC) that implements the logic function, the target process node can be associated with the transistors of the ASIC being emulated. The target process node is typically in the units of nanometers (nm). The target process node can be one of, for example, 90 nm, 65 nm, 40 nm, 28 nm, etc., with each number being associated with a minimum transistor channel length supported by the target process node. A logic function to be implemented on the field programmable device to emulate the ASIC can then be associated with the target process node of the ASIC.

The aforementioned information about the logic functions can be extracted from a database (e.g., logic function information database 120). The logic functions can be organized, in the database, into subsystems of a system to be implemented on a field programmable device, with each subsystem being associated with the aforementioned information. As an illustrative example, a digital signal processor (DSP) is to be implemented on a field programmable device. The digital signal processor may include a plurality of stages to perform pipelined processing, with each stage including a plurality of registers to store an output of the previous stage. The digital signal processor may also include arithmetic logics configured to perform computation (e.g., multiplication and addition to carry out Fast-Fourier transform), as well as control logics configured to control the flow of data between the pipeline stages. The registers, the control logics, as well as the arithmetic logics can be organized as subsystems, with each subsystem being associated with a target clock frequency, a target process node, a nature of the logic function, and an expected gate count.

For example, the control logics and the registers can be associated with a target frequency of a clock that triggers the storing of data at the registers. The registers can also be associated with a target process node (e.g., whether the registers are to be implemented using a 90 nm process, a 65 nm process, etc.), and a nature of the logic function (e.g., the registers are sequential logics). The control logics and the registers can also be associated an expected gate count. The expected gate count can be determined based on, for example, a number of parallel bits in the datapath, which can determine a number of sequential logic elements (e.g., flip-flops) included in the control logics and the registers. The expected gate count can also be determined based on the features to be included in these elements (e.g., whether clock gating and synchronous reset are included), etc. Further, the arithmetic logics can also be associated with, for example, the same target clock frequency and target process node as the interfacing registers. The arithmetic logics can also be associated with a different target clock frequency than other subsystems that include control processing logics, to reflect that the arithmetic logics can typically operate at a higher switching frequency than control processing logics. The arithmetic logics can also be associated with a nature of the logic function (e.g., the arithmetic logics are combinational logics), and an expected gate count determined based on features of the arithmetic logics.

Some of the aforementioned parameters can be interrelated. For example, a target process node can be associated with a certain range of target clock frequencies. As an illustrative example, a 90 nm process node may permit a target clock frequency of, for example, 200 MHz or lower, while a 40 nm process node may permit a target clock frequency of, for example, 300 MHz or lower. The association between the target clock frequency and the target process node can reflect the fact that transistors of a smaller channel length can support a switching operation at a higher frequency than transistors of a larger channel length. Further, a target process node may also be associated with a certain gate count. Using the illustrative example above, in a case where the field programmable device is used to emulate the behavior of an application specific integrated circuit (ASIC), a maximum number of transistors that can be included in the ASIC can depend on a physical die size of the ASIC, as well as the minimum channel length of the transistors (which can determine a footprint size of the transistors) included in the ASIC. The association between the target process node and the gate count can be configured to reflect such a relationship. For example, a scaling factor can be introduced to the gate count for a logic function, based on the target process node associated with the logic function.

In some embodiments, the aforementioned information about the logic functions can be expressed in the format of HDL, and can be stored in the database as one or more electronic files. A target design (e.g., a digital signal processor) that comprises one or more logic functions can be associated with an identifier and associated with one or more electronic files that store the information, in the form of HDL, for the subsystems of the target design. The information, as well as the associations, can also be stored in logic function information database 120. In some embodiments, logic function information identification module 102 can receive an instruction to configure a field programmable device to implement a target design, with the instruction including an identifier of the target design. Logic function information identification module 102 can then extract, from logic function information database 120, the information about the one or more logic functions associated with the target design, based on the identifier included in the instruction.

In some embodiments, attributes determination module 104 can determine one or more attributes for each of the subsystems to be implemented, based on the aforementioned parameters (e.g., target clock frequencies, target process node, a nature of the logic functions, a gate count, etc.) identified by logic function information identification module 102. The attributes can include, for example, a pipeline factor (pf) and a speed factor (sf), and both of the pipeline factor and the speed factor can be associated with each of the subsystems included in a target design stored at logic function information database 120. As to be discussed below, the pipeline factor and the speed factor can be used to estimate the gate count of the sequential logic blocks and the combinational logic blocks required to implement the logic functions of a subsystem.

In some embodiments, the pipeline factor can be determined based on, for example, a nature of the logic function. Using the illustrative example discussed before, the control logics and the registers for a pipelined digital signal processor can determined, by logic function information identification module 102, as sequential logics. Based on this determination, attributes determination module 104 may determine a value of 1 for a pipeline factor of a subsystem that includes one or more of the registers and the control logics of the digital signal processor. On the other hand, logic function information identification module 102 may also determine that the arithmetic logics are combinational logics. Based on this determination, attributes determination module 104 may determine a value of 0 for a pipeline factor of a subsystem that includes the arithmetic logics.

In some embodiments, the speed factor can be determined based on, for example, the target clock frequency and the target process node. As discussed above, a target process node can be associated with a certain range of target clock frequencies. Using the illustrative example above, a 90 nm process node may permit a target clock frequency of, for example, 200 MHz or lower, while a 40 nm process node may permit a target clock frequency of, for example, 300 MHz or lower. The speed factor can be determined based on whether the target clock frequency is within a certain range of the maximum target clock frequency permitted by the target process node. As an illustrative example, the threshold can be 150 MHz for a 90 nm process node, such that a subsystem with a target clock frequency of 160 MHz (over the 150 MHz threshold) for a 90 nm process node can be associated with a value of 1 for the speed factor. On the other hand, a subsystem with a target clock frequency of 140 MHz (below the 150 MHz threshold) for a 90 nm process node can be associated with a value of 0 for the speed factor.

In some embodiments, the values of the speed factor and the pipeline factor can be interrelated. For example, in a case where the value of the speed factor associated with a subsystem is 0, the pipeline factor of the subsystem can be either 0 or 1, which indicates that the logic function is either combinational or sequential logic. On the other hand, in a case where the value of the speed factor associated with a subsystem is 1, the pipeline factor of the subsystem can only be 0, which indicates that the logic function is dominated by combinational logic. Such interrelation can reflect that when the expected frequency is high for a given process node, that would be applicable to combinational logic. And when expected frequency is low for a given process node, that would be equally applicable for both combinational and sequential logic.

It is understood that the values of the pipeline factors and the speed factors are provided here for illustration purpose only, and do not limit the scope of the present disclosure.

In some embodiments, component requirement determine module 106 can determine, for each of the subsystems of the target design, a first value indicative of a number of the sequential logic blocks to implement the logic functions of the subsystem, and a second value indicative of a number of the combinational logic blocks to implement the logic functions of the subsystem, based on the parameters determined by logic function information identification module 102, as well as the speed factor and the pipeline factor determined by attributes determination module 104. For a subsystem, component requirement determine module 106 may determine the first value associated with the sequential logics (e.g., a flip-flop) based on the following Equation 1:

$$\text{First value} = \frac{gc \times [(r1) + (r2 - r1) \times (pf + sf)]}{gpf} \quad \text{(Equation 1)}$$

Here, the variable gc may refer to the expected gate count of the subsystem, as determined by logic function information identification module 102. The variables pf and sf may refer to, respectively, the pipeline factor and the speed factor, as determined by attributes determination module 104. The variable gpf may refer to a predetermined average number of NAND2 gates per flip flop, the value of which can be, for example, 8. The value of gpf can be determined based on various factors, such as the features of the flip flops to be used to implement the logic functions of the subsystem (e.g., whether the flip flops include clock gating, synchronous reset, etc.), the types of flip flops available on the field programmable device to be configured, etc.

Further, variables r1 and r2 can be configured to indicate a range of the percentage of gates of a subsystem associated with sequential logics. The values of r1 and r2 can be, for example, 30% and 40%. The contributions of values of variables r1 and r2 to the first value, in equation 1, are based on the pipeline factor (pf) and the speed factor (sf), and can reflect the nature of the logic functions of the subsystem For example, in a case where the subsystem is for control processing and is dominated by sequential logics (hence with a value of pipeline factor set to one), the value of r2 will come into picture in determining the first value. On the other hand, in a case where the subsystem is for arithmetic operation and is dominated by combinational logics, the sum of pipeline and speed factors can be zero, and the value of r1 will come into picture in determining the first value.

As an illustrative example, assuming that for a subsystem for control logics, gc equals 6000, r1 equals 30%, r2 equals 40%, pf equals 1, sf equals 0, and gpf equals 8, the first value can be determined, based on Equation 1, as 300. The number 300 can be indicative of an estimated number of flip flops to implement the subsystem on a field programmable device.

Moreover, after the determination of the first value, component requirement determine module 106 can also determine, for each of the subsystems of the target design, a second value indicative of an estimation of a number of the combinational logics to implement the subsystem, based on the following Equation 2:

$$\text{Second value} = \frac{gc - (\text{first value} \times gpf)}{agpl} \quad \text{(Equation 2)}$$

Here, as in Equation 1, the variable gc may refer to the expected gate count of the subsystem, as determined by logic function information identification module 102, and the variable gpf may refer to a predetermined average number of NAND2 gates per flip flop, the value of which can be, for example, 8. The first value is determined based on Equation 1 and is indicative of a number of the sequential logic blocks (e.g., flip flop) to implement the logic functions of the subsystem. The variable agpl may refer to a predetermined average number of gates per look up table to be configured to implement the combination logics. The value of agpl can be based on various factors, such as a number of inputs in the look up table. For example, the value of agpl can be determined based on the following Equation 3:

$$\text{agpl} = (n-1) \times mf \quad \text{(Equation 2)}$$

Here, the variable n can refer to a number of inputs to the look up table, and mf can refer to a multiplication factor. As an illustrative example, in a case where the number of inputs (n) to the look up tables available on a field programmable device is 4, a value of mf is 2, the value of agpl can be calculated as 6. Using the illustrative example above, with gc equals 6000 and first value being calculated as 300, the second value can be calculated as 600. The number 600 can be indicative of an estimated number of 4-input lookup tables to implement the subsystem on a field programmable device.

After determining the first value and the second value for each of the subsystems, component requirement determination module 106 can then determine a first cumulative value indicative of an estimation of a total number of the sequential logic blocks, and a second cumulative value indicative of an estimation of a total number of the combinational logic blocks, for implementing the target design. The first cumulative value can be determined by, for example, a summation of the first values of all of the subsystems of the target design. The second cumulative value can also be determined by, for example, a summation of the second values of all of the subsystems of the target design. In some embodiments, component requirement determination module 106 can also scale up the first and second cumulative values with a scale factor to allocate for design margin. In some embodiments, the scaling factor can be 1.67 or above.

In some embodiments, field programmable device determination module 108 can determine whether to configure a field programmable device to implement the target design. The determination can be based on the estimated number of sequential and combinational logic blocks to implement a target design, as determined by component requirement determination module 106. The determination can also be based on a number of sequential and combinational logic blocks available, at a field programmable device, for configuration. For example, if a number of sequential logic blocks available at a field programmable device exceeds (or equal to) the first cumulative value, and if a number of combinational logic blocks available at that field programmable device also exceeds (or equal to) the second cumulative value, field programmable device determination module 108 can determine to configure that field programmable device to implement the target design.

In some embodiments, field programmable device determination module 108 can determine whether to configure a field programmable device based on other factors. For example, field programmable device determination module 108 can also determinate an expected rate of utilization of the field programmable device, when the device is configured to implement the target design, and can determine to configure that field programmable device if the expected rate of utilization exceeds a certain threshold. The expected rate of utilization can be determined based on a ratio between a sum of the first and the second cumulative values, and a sum of the number of sequential and combinational logic blocks available at the field programmable device.

In some embodiments, the information about the number of sequential and combinational logic blocks available at the field programmable device can be stored at field programmable device database 130. The information can be associated with, for example, an identifier associated with a particular field programmable device. In some embodiments, field programmable device determination module 108 may extract the information for each of the field programmable devices stored at field programmable device database 130, and then select a field programmable device for configuration to implement a target design, if a number of combinational logic blocks and a number of sequential logic blocks available at the device exceeds, respectively, the first and second cumulative values, and that the expected rate of utilization is the maximum among the field programmable devices of which the information about available combinational and sequential logic blocks are stored at field programmable device database 130.

In some embodiments, field programmable device configuration module 110 may configure a field programmable device selected by field programmable device determination module 108. In some embodiments, field programmable device configuration module 110 may interface with one or more field programmable devices 150, and acquire an identifier from each of the one or more field programmable devices 150. Field programmable device configuration module 110 can then compare the identifier against, for example, an identifier of the selected field programmable device. If the identifiers match, field programmable device configuration module 110 may configure the field programmable devices 150 to implement the target design. As discussed above, field programmable device configuration system 100 may be part of, or can operate in conjunction with, an electronic design automatic (EDA) tool. Field programmable device configuration module 110 may receive a set of low level programming instructions generated by a compilation of a program file that includes HDL associated with the target design, and transmit the low level programming instructions to the selected field programmable devices 150, to configure the logic blocks and components (e.g., look-up tables, flip flops, and routing matrices, etc.) of the selected field programmable device, for implementing the target design.

Figure 2:
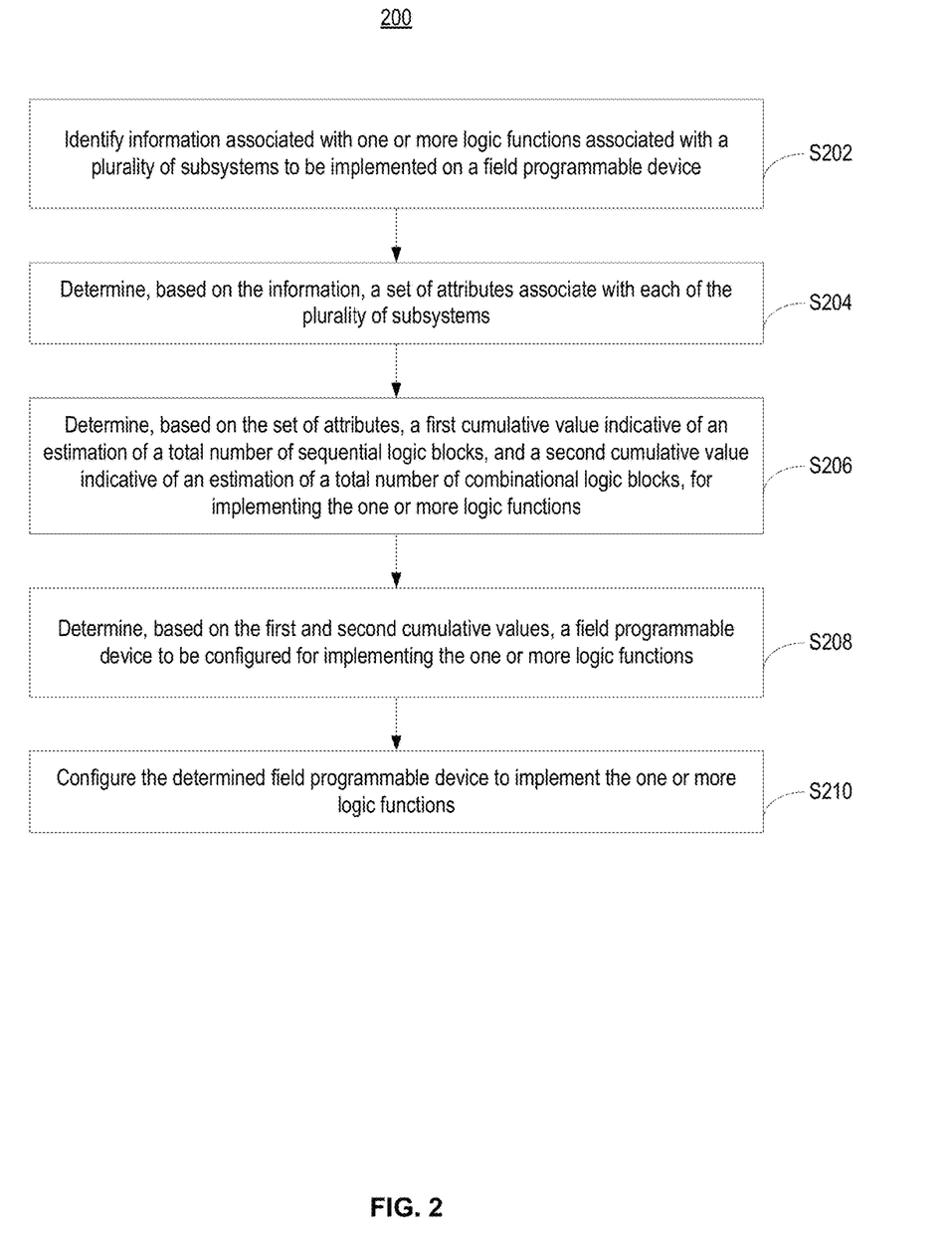
FIG. 2 illustrates an exemplary method for configuring a field programmable device, according to embodiments of the present disclosure.

FIG. 2 illustrates an exemplary method 200 for configuring a field programmable device, according to embodiments of the present disclosure. In some embodiments, method 200 can be performed by a system comprising one or more hardware processors (e.g., field programmable device configuration system 100 of FIG. 1). As shown in FIG. 2, method 200 may include steps S202 to S210.

In step S202, the system may identify information associated with one or more logic functions associated with a plurality of subsystems to be implemented on a field programmable device. The logic functions can include, for example, arithmetic operation (e.g., addition, subtraction, multiplication and division of input data), and control processing (e.g., generating a sequence of states and outputs at pre-determined times based on input data), etc. The information associated with the logic functions can include various parameters, for example, target clock frequencies, target process nodes, a nature of the logic functions (e.g., whether the logic functions are predominantly for arithmetic operation or for control processing), and an expected size of circuit components for implementing the logic functions, which can be represented in terms of gate count in terms of, for example, equivalent NAND2 gates. The gate count is typically in the units of kilo-gates or million-gates. The clock frequency is typically in the unit of mega-Hz (MHz) or giga-Hz (GHz). In a case where the field programmable device is to emulate the behavior of an application specific integrated circuit (ASIC) that implements the logic function, the target process node can be associated with the transistors of the ASIC being emulated. In some embodiments, step S202 can be performed by logic function information identification module 102, and the information can be obtained from logic function information database 120 of FIG. 1.

In step S204, the system may determine a set of attributes associate with each of the plurality of subsystems, based on the information determined in step S202. The attributes can include, for example, a pipeline factor (pf) and a speed factor (sf), and each of the pipeline factor and the speed factor can be associated with each of the plurality of subsystems. The pipeline factor can be determined based on, for example, a nature of one or more logic functions associated a subsystem, while the speed factor can be determined based on, for example, a target clock frequency and a target process node associated with a subsystem. In some embodiments, step S204 can be performed by attributes determination module 104 of FIG. 1.

In step S206, the system may determine, based on the set of attributes, a first cumulative value indicative of an estimation of a total number of the sequential logic blocks, and a second cumulative value indicative of an estimation of a total number of the combinational logic blocks, for implementing the one or more logic functions associated with the plurality of subsystems. The first cumulative value can be generated based on a summation of a first value indicative of an estimation of a number of the sequential logic blocks to implement the logic functions of each of the subsystems, the second cumulative value can be generated based on a summation of a second value indicative of an estimation of a number of the combinational logic blocks to implement the logic functions of each of the subsystems. The first value can be generated based on, for example, the expected gate count, the pipeline factor, and the speed factor associated with a subsystem, and a predetermined average number of NAND2 gates per flip flop. The second value can be generated based on the first value, the predetermined average number of NAND2 gates per flip flop, and a predetermined average number of gates per look up table. In some embodiments, step S206 can be performed by component requirement determination module 106 of FIG. 1.

In step S208, the system may determine a field programmable device to be configured for implementing the one or more logic functions. The determination can be based on the first and second cumulative values, and a number of sequential and combinational logic blocks available, at a field programmable device, for configuration. For example, if a number of sequential logic blocks available at a field programmable device exceeds (or equal to) the first cumulative value, and if a number of combinational logic blocks available at that field programmable device also exceeds (or equal to) the second cumulative value, that field programmable device can be selected to implement the one or more logic functions. Further, the field programmable device can also be selected if an expected rate of utilization of the device, when configured to implement the one or more logic functions, exceeds a certain threshold. The information about a number of sequential and combinational logic blocks available for a field programmable device can be stored at, for example, at field programmable device database 130, and the system can extract the information from the database for comparison against the first and second cumulative values. In some embodiments, step S208 can be performed by field programmable device determination module 108 of FIG. 1.

In step S210, the system may configure the determined field programmable device to implement the one or more logic functions. For example, the system may receive a set of low level programming instructions generated by a compilation of a program file that includes HDL associated with the target design, and transmit the low level programming instructions to the determined field programmable device, to configure the logic blocks and components (e.g., look-up tables, flip flops, and routing matrices, etc.) of the selected field programmable device, for implementing the one or more logic functions. In some embodiments, step S210 can be performed by field programmable device configuration module 110 of FIG. 1.

Computer System

Figure 3:
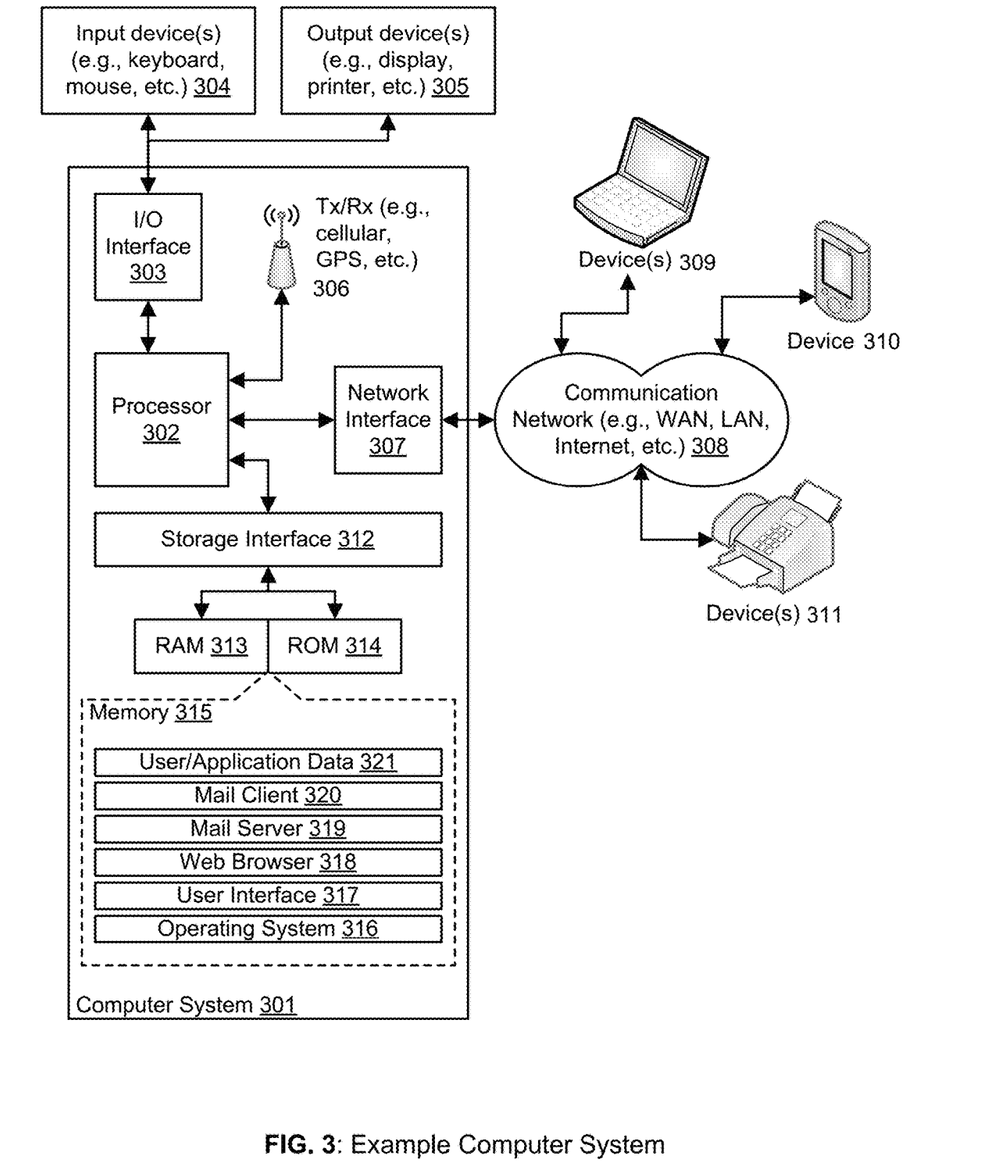
FIG. 3 is a block diagram of an exemplary system for implementing embodiments consistent with the present disclosure.

FIG. 3 is a block diagram of an exemplary computer system for implementing embodiments consistent with the present disclosure. Variations of computer system 301 may be used for implementing the devices and systems disclosed herein. Computer system 301 may comprise a central processing unit ("CPU" or "processor") 302. Processor 302 may comprise at least one data processor for executing program components for executing user- or system-generated requests. A user may include a person, a person using a device such as those included in this disclosure, or such a device itself. The processor may include specialized processing units such as integrated system (bus) controllers, memory management control units, floating point units, graphics processing units, digital signal processing units, etc. The processor may include a microprocessor, such as AMD Athlon, Duron or Opteron, ARM's application, embedded or secure processors, IBM PowerPC, Intel's Core, Itanium, Xeon, Celeron or other line of processors, etc. The processor 302 may be implemented using mainframe, distributed processor, multi-core, parallel, grid, or other architectures. Some embodiments may utilize embedded technologies like application-specific integrated circuits (ASICs), digital signal processors (DSPs), Field Programmable Gate Arrays (FPGAs), etc.

Processor 302 may be disposed in communication with one or more input/output (I/O) devices via I/O interface 303. The I/O interface 303 may employ communication protocols/methods such as, without limitation, audio, analog, digital, monoaural, RCA, stereo, IEEE-1394, serial bus, universal serial bus (USB), infrared, PS/2, BNC, coaxial, component, composite, digital visual interface (DVI), high-definition multimedia interface (HDMI), RF antennas, S-Video, VGA, IEEE 802.11 a/b/g/n/x, Bluetooth, cellular (e.g., code-division multiple access (CDMA), high-speed packet access (HSPA+), global system for mobile communications (GSM), long-term evolution (LTE), WiMax, or the like), etc.

Using the I/O interface 303, the computer system 301 may communicate with one or more I/O devices. For example, the input device 304 may be an antenna, keyboard, mouse, joystick, (infrared) remote control, camera, card reader, fax machine, dongle, biometric reader, microphone, touch screen, touchpad, trackball, sensor (e.g., accelerometer, light sensor, GPS, gyroscope, proximity sensor, or the like), stylus, scanner, storage device, transceiver, video device/source, visors, etc. Output device 305 may be a printer, fax machine, video display (e.g., cathode ray tube (CRT), liquid crystal display (LCD), light-emitting diode (LED), plasma, or the like), audio speaker, etc. In some embodiments, a transceiver 306 may be disposed in connection with the processor 302. The transceiver may facilitate various types of wireless transmission or reception. For example, the transceiver may include an antenna operatively connected to a transceiver chip (e.g., Texas Instruments WiLink WL1283, Broadcom BCM4750IUB8, Infineon Technologies X-Gold 618-PMB9800, or the like), providing IEEE 802.11a/b/g/n, Bluetooth, FM, global positioning system (GPS), 2G/3G HSDPA/HSUPA communications, etc.

In some embodiments, the processor 302 may be disposed in communication with a communication network 308 via a network interface 307. The network interface 307 may communicate with the communication network 308. The network interface may employ connection protocols including, without limitation, direct connect, Ethernet (e.g., twisted pair 10/100/1000 Base T), transmission control protocol/internet protocol (TCP/IP), token ring, IEEE 802.11a/b/g/n/x, etc. The communication network 308 may include, without limitation, a direct interconnection, local area network (LAN), wide area network (WAN), wireless network (e.g., using Wireless Application Protocol), the Internet, etc. Using the network interface 307 and the communication network 308, the computer system 301 may communicate with devices 310, 311, and 312. These devices may include, without limitation, personal computer(s), server(s), fax machines, printers, scanners, various mobile devices such as cellular telephones, smartphones (e.g., Apple iPhone, Blackberry, Android-based phones, etc.), tablet computers, eBook readers (Amazon Kindle, Nook, etc.), laptop computers, notebooks, gaming consoles (Microsoft Xbox, Nintendo DS, Sony PlayStation, etc.), or the like. In some embodiments, the computer system 301 may itself embody one or more of these devices.

In some embodiments, the processor 302 may be disposed in communication with one or more memory devices (e.g., RAM 313, ROM 314, etc.) via a storage interface 312. The storage interface may connect to memory devices including, without limitation, memory drives, removable disc drives, etc., employing connection protocols such as serial advanced technology attachment (SATA), integrated drive electronics (IDE), IEEE-1394, universal serial bus (USB), fiber channel, small computer systems interface (SCSI), etc. The memory drives may further include a drum, magnetic disc drive, magneto-optical drive, optical drive, redundant array of independent discs (RAID), solid-state memory devices, solid-state drives, etc. Variations of memory devices may be used for implementing, for example, the databases disclosed herein.

The memory devices may store a collection of program or database components, including, without limitation, an operating system 316, user interface application 317, web browser 318, mail server 319, mail client 320, user/application data 321 (e.g., program files written based on HDL to describe behaviors of a target design, an application that translate the HDL into low level instructions for configuring a field programmable device, etc.), etc. The operating system 316 may facilitate resource management and operation of the computer system 301. Examples of operating systems include, without limitation, Apple Macintosh OS X, Unix, Unix-like system distributions (e.g., Berkeley Software Distribution (BSD), FreeBSD, NetBSD, OpenBSD, etc.), Linux distributions (e.g., Red Hat, Ubuntu, Kubuntu, etc.), IBM OS/2, Microsoft Windows (XP, Vista/7/8, etc.), Apple iOS, Google Android, Blackberry OS, or the like. User interface 317 may facilitate display, execution, interaction, manipulation, or operation of program components through textual or graphical facilities. For example, user interfaces may provide computer interaction interface elements on a display system operatively connected to the computer system 301, such as cursors, icons, check boxes, menus, scrollers, windows, widgets, etc. Graphical user interfaces (GUIs) may be employed, including, without limitation, Apple Macintosh operating systems' Aqua, IBM OS/2, Microsoft Windows (e.g., Aero, Metro, etc.), Unix X-Windows, web interface libraries (e.g., ActiveX, Java, Javascript, AJAX, HTML, Adobe Flash, etc.), or the like.

In some embodiments, the computer system 301 may implement a web browser 318 stored program component. The web browser may be a hypertext viewing application, such as Microsoft Internet Explorer, Google Chrome, Mozilla Firefox, Apple Safari, etc. Secure web browsing may be provided using HTTPS (secure hypertext transport protocol), secure sockets layer (SSL), Transport Layer Security (TLS), etc. Web browsers may utilize facilities such as AJAX, DHTML, Adobe Flash, JavaScript, Java, application programming interfaces (APIs), etc. In some embodiments, the computer system 301 may implement a mail server 319 stored program component. The mail server may be an Internet mail server such as Microsoft Exchange, or the like. The mail server may utilize facilities such as ASP, ActiveX, ANSI C++/C#, Microsoft .NET, CGI scripts, Java, JavaScript, PERL, PHP, Python, WebObjects, etc. The mail server may utilize communication protocols such as internet message access protocol (IMAP), messaging application programming interface (MAPI), Microsoft Exchange, post office protocol (POP), simple mail transfer protocol (SMTP), or the like. In some embodiments, the computer system 301 may implement a mail client 320 stored program component. The mail client may be a mail viewing application, such as Apple Mail, Microsoft Entourage, Microsoft Outlook, Mozilla Thunderbird, etc.

In some embodiments, computer system 301 may store user/application data 321, such as the data, variables, records, etc. as described in this disclosure. Such databases may be implemented as fault-tolerant, relational, scalable, secure databases such as Oracle or Sybase. Alternatively, such databases may be implemented using standardized data structures, such as an array, hash, linked list, struct, structured text file (e.g., XML), table, or as object-oriented databases (e.g., using ObjectStore, Poet, Zope, etc.). Such databases may be consolidated or distributed, sometimes among the various computer systems discussed above in this disclosure. It is to be understood that the structure and operation of any computer or database component may be combined, consolidated, or distributed in any working combination.

The specification has described methods and systems for configuring a field programmable device. The illustrated steps are set out to explain the exemplary embodiments shown, and it should be anticipated that ongoing technological development will change the manner in which particular functions are performed. These examples are presented herein for purposes of illustration, and not limitation. Further, the boundaries of the functional building blocks have been arbitrarily defined herein for the convenience of the description. Alternative boundaries can be defined so long as the specified functions and relationships thereof are appropriately performed. Alternatives (including equivalents, extensions, variations, deviations, etc., of those described herein) will be apparent to persons skilled in the relevant art(s) based on the teachings contained herein. Such alternatives fall within the scope and spirit of the disclosed embodiments. Also, the words "comprising," "having," "containing," and "including," and other similar forms are intended to be equivalent in meaning and be open ended in that an item or items following any one of these words is not meant to be an exhaustive listing of such item or items, or meant to be limited to only the listed item or items. It must also be noted that as used herein and in the appended claims, the singular forms "a," "an," and "the" include plural references unless the context clearly dictates otherwise.

Furthermore, one or more computer-readable storage media may be utilized in implementing embodiments consistent with the present disclosure. A computer-readable storage medium refers to any type of physical memory on which information or data readable by a processor may be stored. Thus, a computer-readable storage medium may store instructions for execution by one or more processors, including instructions for causing the processor(s) to perform steps or stages consistent with the embodiments described herein. The term "computer-readable medium" should be understood to include tangible items and exclude carrier waves and transient signals, i.e., be non-transitory. Examples include random access memory (RAM), read-only memory (ROM), volatile memory, nonvolatile memory, hard drives, CD ROMs, DVDs, flash drives, disks, and any other known physical storage media.

It is intended that the disclosure and examples be considered as exemplary only, with a true scope and spirit of disclosed embodiments being indicated by the following claims.

What is claimed is:

1. A method for configuring field programmable devices, comprising:
   identifying, by a configuration device, information associated with a plurality of logic functions associated with a plurality of subsystems to be implemented on a field programmable device;
   determining, by the configuration device and based on the information, a set of attributes associated with each of the plurality of subsystems, the set of attributes including an expected gate count, one or more clock frequencies, process node information, and one or more of the plurality of logic functions;
   determining, by the configuration device and based on the set of attributes, a first value indicative of an estimation of a total number of sequential logic blocks, and a second value indicative of an estimation of a total number of combinational logic blocks, for implementing the plurality of logic functions;
   determining, by the configuration device, when the field programmable device is to be configured; and
   configuring, by the configuration device and based on the first and second values, the field programmable device to implement the plurality of logic functions, when the determining indicates that the field programmable device is to be configured.

2. The method of claim 1, further comprising:
   determining, by the configuration device and for each of the plurality of subsystems, a pipeline factor based on the one or more of the plurality of logic functions;
   determining, by the configuration device and for each of the plurality of subsystems, a speed factor based on the one or more clock frequencies and the process node information; and
   determining, by the configuration device, the first value based on one or more of the pipeline factor, the speed factor, the expected gate count for each of the plurality of subsystems, or an average number of gates per flip-flop.

3. The method of claim 2, further comprising determining, by the configuration device, the second value based on one or more of the first value, the average number of gates per flip-flop, or an average number of gates per lookup table.

4. The method of claim 3, wherein the average number of gates per lookup table is determined based on a number of input terminals of the lookup table.

5. The method of claim 1, further comprising:
   determining, by the configuration device, a third value indicative of a total number of sequential logic blocks of the field programmable device available to be configured;
   determining, by the configuration device, a fourth value indicative of a total number of combinational logic blocks of the field programmable device available to be configured;
   determining, by the configuration device, when to configure the field programmable device based on a first relationship between the first and third values, and a second relationship between the second and fourth values.

6. The method of claim 5, further comprising:
   determining, by the configuration device, a first expected utilization rate for the field programmable device based on the first, second, third, and fourth values;
   determining, by the configuration device, a second expected utilization rate for a second field programmable device based on the first and second values; and
   determining, by the configuration device, when field programmable device is to be configured based on a relationship between the first and second expected utilization rates.

7. A configuration device, comprising memory comprising programmed instructions stored in the memory and one or more processors configured to be capable of executing the programmed instructions stored in the memory to:
   identify information associated with a plurality of logic functions associated with a plurality of subsystems to be implemented on a field programmable device;
   determine, based on the information, a set of attributes associated with each of the plurality of subsystems, the set of attributes including an expected gate count, one or more clock frequencies, process node information, and one or more of the plurality of logic functions;
   determine, based on the set of attributes, a first value indicative of an estimation of a total number of sequential logic blocks, and a second value indicative of an estimation of a total number of combinational logic blocks, for implementing the plurality of logic functions;
   determine when the field programmable device is to be configured; and
   configure, based on the first and second values, the field programmable device to implement the plurality of logic functions, when the determining indicates that the field programmable device is to be configured.

8. The configuration device of claim 7, wherein the one or more processors are further configured to be capable of executing the programmed instructions stored in the memory to:
    determine, for each of the plurality of subsystems, a pipeline factor based on the one or more of the plurality of logic functions;
    determine, for each of the plurality of subsystems, a speed factor based on the one or more clock frequencies and the process node information; and
    determine the first value based on one or more of the pipeline factor, the speed factor, the expected gate count for each of the plurality of subsystems, or an average number of gates per flip-flop.

9. The configuration device of claim 8, wherein the one or more processors are further configured to be capable of executing the programmed instructions stored in the memory to determine the second value based on one or more of the first value, the average number of gates per flip-flop, or an average number of gates per lookup table.

10. The configuration device of claim 9, wherein the average number of gates per lookup table is determined based on a number of input terminals of the lookup table.

11. The configuration device of claim 7, wherein the one or more processors are further configured to be capable of executing the programmed instructions stored in the memory to:
    determine a third value indicative of a total number of sequential logic blocks of the field programmable device available to be configured;
    determine a fourth value indicative of a total number of combinational logic blocks of the field programmable device available to be configured;
    determine when to configure the field programmable device based on a first relationship between the first and third values, and a second relationship between the second and fourth values.

12. The configuration device of claim 11, wherein the one or more processors are further configured to be capable of executing the programmed instructions stored in the memory to:
    determine a first expected utilization rate for the field programmable device based on the first, second, third, and fourth values;
    determine a second expected utilization rate for a second field programmable device based on the first and second values; and
    determine when field programmable device is to be configured based on a relationship between the first and second expected utilization rates.

13. A non-transitory computer readable medium having stored thereon instructions for configuring field programmable devices comprising executable code which when executed by one or more processors, causes the processors to perform steps comprising:
    identifying information associated with a plurality of logic functions associated with a plurality of subsystems to be implemented on a field programmable device;
    determining, based on the information, a set of attributes associated with each of the plurality of subsystems, the set of attributes including an expected gate count, one or more clock frequencies, process node information, and one or more of the plurality of logic functions;
    determining, based on the set of attributes, a first value indicative of an estimation of a total number of sequential logic blocks, and a second value indicative of an estimation of a total number of combinational logic blocks, for implementing the plurality of logic functions;
    determining when the field programmable device is to be configured; and
    configuring, based on the first and second values, the field programmable device to implement the plurality of logic functions, when the determining indicates that the field programmable device is to be configured.

14. The non-transitory computer readable medium of claim 13, wherein the executable code when executed by the processors causes the processor to perform one or more additional steps comprising:
    determining, for each of the plurality of subsystems, a pipeline factor based on the one or more of the plurality of logic functions;
    determining, for each of the plurality of subsystems, a speed factor based on the one or more clock frequencies and the process node information; and
    determining the first value based on one or more of the pipeline factor, the speed factor, the expected gate count for each of the plurality of subsystems, or an average number of gates per flip-flop.

15. The non-transitory computer readable medium of claim 14, wherein the executable code when executed by the processors causes the processor to perform one or more additional steps comprising determining the second value based on one or more of the first value, the average number of gates per flip-flop, or an average number of gates per lookup table.

16. The non-transitory computer readable medium of claim 15, wherein the average number of gates per lookup table is determined based on a number of input terminals of the lookup table.

17. The non-transitory computer readable medium of claim 13, wherein the executable code when executed by the processors causes the processor to perform one or more additional steps comprising
    determining a third value indicative of a total number of sequential logic blocks of the field programmable device available to be configured;
    determining a fourth value indicative of a total number of combinational logic blocks of the field programmable device available to be configured;
    determining when to configure the field programmable device based on a first relationship between the first and third values, and a second relationship between the second and fourth values.

18. The non-transitory computer readable medium of claim 17, wherein the executable code when executed by the processors causes the processor to perform one or more additional steps comprising determining a first expected utilization rate for the field programmable device based on the first, second, third, and fourth values;
    determining a second expected utilization rate for a second field programmable device based on the first and second values; and
    determining when field programmable device is to be configured based on a relationship between the first and second expected utilization rates.

* * * * *